United States Patent [19]

Sakuraba et al.

[11] Patent Number: 6,013,357
[45] Date of Patent: *Jan. 11, 2000

[54] POWER MODULE CIRCUIT BOARD AND A PROCESS FOR THE MANUFACTURE THEREOF

[75] Inventors: Masami Sakuraba; Masami Kimura; Junji Nakamura; Masaya Takahara, all of Shiojiri, Japan

[73] Assignee: Dowa Mining Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/917,328

[22] Filed: Aug. 25, 1997

[30] Foreign Application Priority Data

Aug. 27, 1996 [JP] Japan .................................. 8-244075

[51] Int. Cl.⁷ ...................................................... B32B 3/00
[52] U.S. Cl. ........................... 428/210; 428/209; 428/910; 427/96; 361/736; 361/746
[58] Field of Search .................................. 428/209, 210; 361/746, 736

[56] References Cited

U.S. PATENT DOCUMENTS

| | | | |
|---|---|---|---|
| 3,892,835 | 7/1975 | Holdsworth | 264/332 |
| 4,770,953 | 9/1988 | Horiguchi et al. | 428/210 |
| 4,849,292 | 7/1989 | Mizunoya et al. | 428/433 |
| 4,920,640 | 5/1990 | Enloe et al. | 29/852 |
| 5,063,121 | 11/1991 | Sato et al. | 428/210 |
| 5,085,923 | 2/1992 | Yamakawa et al. | 428/209 |
| 5,326,623 | 7/1994 | Yamakawa et al. | 428/210 |
| 5,363,278 | 11/1994 | Komorita et al. | 361/762 |
| 5,439,856 | 8/1995 | Komatsu | 501/97 |

FOREIGN PATENT DOCUMENTS

| | | |
|---|---|---|
| 282 285 | 9/1988 | European Pat. Off. . |
| 515 061 | 11/1992 | European Pat. Off. . |
| 2-149485 | 6/1990 | Japan . |
| 2-258686 | 10/1990 | Japan . |
| 3-93687 | 4/1991 | Japan . |
| 6-53624 | 2/1994 | Japan . |

OTHER PUBLICATIONS

*Patent Abstracts of Japan*, vol. 016, No. 369, Aug. 10, 1992 of JP 04 119975, Apr. 21, 1992.
*Patent Abstracts of Japan*, vol. 014, No. 017 (C–675), Jan. 16, 1990 of JP 01 261279, Oct. 18, 1989.
*Patent Abstracts of Japan*, vol. 016, No. 165 (M–1238), Apr. 21, 1992 of JP 04 013507, Jan. 17, 1992.

Primary Examiner—Deborah Jones
Assistant Examiner—Cathy F. Lam
Attorney, Agent, or Firm—Frishauf, Holtz, Goodman, Langer & Chick, P.C.

[57] ABSTRACT

A conductor pattern is formed on at least one surface of an AlN- or $Si_3N_4$-based ceramic substrate which is such that the ratio between the principal metal component binding with N to form the ceramic mass and the B in the BN remaining on the surface layer is no more than $50 \times 10^{-6}$ as either B/Al or B/Si, wherein B/Al represents the ratio of $I_B$ to $I_{Al}$ where $I_B$ is the X-ray diffraction intensity of boron present on the surface layer and $I_{Al}$ is the X-ray diffraction intensity of aluminum, and B/Si represents the ratio of $I_B$ to $I_{Si}$ where $I_B$ is as defined above and $I_{Si}$ is the X-ray diffraction intensity of silicon. The thus produced circuit board has both a peel strength of at least 30 kg/mm² and a capability of withstanding at least 30 heat cycles and, hence, satisfies the performance requirements of the recent models of power module ceramic circuit boards.

12 Claims, No Drawings

POWER MODULE CIRCUIT BOARD AND A PROCESS FOR THE MANUFACTURE THEREOF

BACKGROUND OF THE INVENTION

This invention relates to a circuit board comprising a high-strength ceramic-and-metal composite, as well as a process for its manufacture. More specifically, the invention relates to a power module circuit board having such a sufficiently high resistance to heat cycles that it is suitable for mounting integrated circuits and semiconductor components. The invention also relates to a process for the manufacture of such power module circuit board.

Ceramic circuit boards having conductor patterns have been extensively used as substrates for mounting power devices such as power transistors, IGBT (Insulated Gate Bipolar Transistor), IPM (Integrated Power Module) and power modules that generate large amounts of heat. In recent years, particular attention has been drawn to the application of AlN ceramic circuit boards having high heat conductivity and in order to fabricate quality AlN ceramic circuit boards, various design improvements have been added to such aspects as the manufacture of ceramic substrates and the formation of conductor patterns.

To take the manufacture of AlN ceramic substrates as an example, rare earth oxides typified by yttria ($Y_2O_3$) or alkaline earth oxides typified by calcia are added as sintering additives in order to produce dense substrates; stated more specifically, AlN ceramic substrates having high heat conductivity that are currently sold on the market have $Y_2O_3$ added in amounts of about 2–8 wt %.

In mass production of AlN ceramic substrates, from several to several tens of substrates are stacked and sintered at a time, with release agents such as boron nitride (BN) being commonly employed in order to prevent one substrate from adhering to another.

Conductor patterns are conventionally formed on the surface of ceramic substrates by the following three common methods: metallization in which a conductive paste is printed on the substrate surface and fired at an elevated temperature to form the intended conductor pattern (Unexamined Published Japanese Patent Application No. 149485/1990); direct bonding in which an AlN ceramic substrate is preliminarily treated at a temperature of about 1,000° C. in air to form alumina on the substrate surface, followed by either heating in an inert gas atmosphere using an oxygen-containing copper plate or heating in an oxidizing atmosphere using an oxygen-free copper plate, to thereby create a eutectic solution of $Cu_2O$ and Cu at the interface such that the AlN ceramic circuit substrate having alumina formed on the surface is joined to the copper plate so as to form the desired conductor pattern (Unexamined Published Japanese Patent Application No. 93687/1991); and brazing in which a brazing material is coated in a circuit pattern on the substrate surface and a copper part placed on the brazing material is heated so that the copper part is joined to the substrate, thereby forming the intended conductor pattern. Direct bonding and brazing are the two methods that have principally been employed to form conductor patterns in the manufacture of power circuit boards.

According to Unexamined Published Japanese Patent Application No. 258686/1990, AlN ceramic circuit substrates have a surface layer rich in the bleeding grain boundary phase constituents and impurities such as a release agent remaining on the surface will interfere with the effective joining between aluminum nitride and the formed conductor patterns; therefore, in order to form conductor patterns by metallization, the grain boundary phase constituents have to be removed by a suitable technique such as lapping and honing.

According to Unexamined Published Japanese Patent Application No. 149485/1990, the grain boundary phase constituents crystallizing out on the surface of an AlN ceramic substrate roughen the substrate surface to thereby lower the strength of the joint between the ceramic substrate and the conductor, as well as impairing the heat conductivity of the circuit board; to avoid these difficulties, the stated patent proposes that the grain boundary phase constituents be removed from the substrate surface by means of liquid solvents.

According to Unexamined Published Japanese Patent Application No. 93687/1991, the grain boundary phase constituents crystallizing out on the surface of an AlN ceramic circuit substrate are practically insensitive to an oxidation treatment and will remain on the substrate surface, thereby lowering the strength of adhesion between a surface coating layer (i.e., an aluminum oxide layer in the direct bonding method) and the ceramic substrate; to overcome this difficulty, the stated patent proposes that the surface coating layer be formed after removing the grain boundary phase constituents by applying a chemical surface treatment with an acidic solution.

As it turned out, however, the peel strength and the number of heat cycles that could be withstood by the ceramic circuit boards manufactured by the joining methods described above were not high enough to meet the requirements for use with recent versions of power modules; the peel strength was only about 10 kg/cm and the number of heat cycles was less than 100, both in terms of practically effective values.

In order to solve these problems, the assignee conducted intensive studies and found that the flexural strength of a ceramic substrate, the weight ratio between the oxygen to yttrium contents in the substrate, the residual boron nitride content on the substrate surface and the joining temperature had significant effects on the strength of joint; based on this finding, the assignee previously proposed a high-strength aluminum nitride circuit board having a peel strength of at least 30 kg/mm² in Unexamined Published Japanese Patent Application No. 53624/1994.

Power module ceramic circuit boards have not only semiconductors and integrated circuits, but also macroscopic electrodes connected thereto and, hence, are subject to substantial forces and this has made it necessary to develop circuit boards having higher peel strength and being capable of withstanding more heat cycles.

The assignee disclosed in Unexamined Published Japanese Patent Application No. 53624/1994, supra, that when an aluminum nitride substrate in which the ratio between the X-ray diffraction intensity of boron nitride ($I_{BN}$) present on the surface layer and the X-ray diffraction intensity of aluminum nitride ($I_{AlN}$) was no more than $6 \times 10^{-2}$ was joined to a copper plate with an active metallic brazing material interposed therebetween had a peel strength of at least 30 kg/mm².

Recent models of power module ceramic circuit boards require that peel strengths of at least 30 kg/mm² be exhibited in combination with the ability to withstand more than 30 heat cycles which is a typical value for the existing modules. However, the high-strength AlN circuit board previously proposed by the assignee cannot be manufactured as a copper-bonded circuit board that satisfies both requirements.

SUMMARY OF THE INVENTION

An object, therefore, of the invention is to provide a power module circuit board that solves the aforementioned problems of the prior art.

In order to attain this object, the present inventors conducted intensive studies, particularly about the correlationship between the type of a ceramic substrate to be used as the starting material and the residual BN content of the substrate surface, and found that the heat cycle characteristics of the produced circuit board were dependent on the B/Al and B/Si ratios, wherein B/Al represents the ratio of $I_B$ to $I_{Al}$ where $I_B$ is the X-ray diffraction intensity of boron present on the surface layer and $I_{Al}$ is the X-ray diffraction intensity of aluminum, and B/Si represents the ratio of $I_B$ to $I_{Si}$ where $I_B$ is as defined above and $I_{Si}$ is the X-ray diffraction intensity of silicon. The present invention has been accomplished on the basis of this finding.

Thus, according to a first aspect of the invention, there is provided a power module circuit board using an AlN- or $Si_3N_4$-based ceramic substrate which has a conductor pattern formed on at least one surface thereof, said ceramic substrate being such that the ratio between the principal metal component which binds with N to form the ceramic mass and the B in the BN remaining on the surface layer is no more than $50 \times 10^{-6}$ as either B/Al or B/Si, wherein B/Al represents the ratio of $I_B$ to $I_{Al}$ where $I_B$ is the X-ray diffraction intensity of boron present on the surface layer and $I_{Al}$ is the X-ray diffraction intensity of aluminum, and B/Si represents the ratio of $I_B$ to $I_{Si}$ where $I_B$ is as defined above and $I_{Si}$ is the X-ray diffraction intensity of silicon.

In a preferred embodiment, the circuit board has the conductor pattern formed of a metal plate that is joined to the ceramic substrate with a brazing material interposed therebetween which contains at least one active metal selected from the group consisting of Ti, Zr and Hf.

In another preferred embodiment, the circuit board has the conductor pattern formed of a metal plate that is joined directly to the ceramic substrate after it has been partially oxidized on the surface.

According to a second aspect of the invention, there is provided a process for producing a power module circuit board using an AlN- or $Si_3N_4$-based ceramic substrate, which comprises the steps of forming a conductor pattern on at least one principal surface of the ceramic substrate, with a brazing material interposed therebetween, said ceramic substrate being such that the ratio between the principal metal component which binds with N to form the ceramic mass and the B in the BN remaining on the surface layer is no more than $50 \times 10^{-6}$ as either B/Al or B/Si wherein B/Al represents the ratio of $I_B$ to $I_{Al}$ where $I_B$ is the X-ray diffraction intensity of boron present on the surface layer and $I_{Al}$ is the X-ray diffraction intensity of aluminum, and B/Si represents the ratio of $I_B$ to $I_{Si}$ where $I_B$ is as defined above and $I_{Si}$ is the X-ray diffraction intensity of silicon, and said brazing material containing at least one element selected from the group consisting of Ti, Zr and Hf or a hydroxide or oxide of such element, and heating the combination in either vacuum or an argon atmosphere such that the metal plate of which the conductor pattern is to be formed is joined to said ceramic substrate.

DETAILED DESCRIPTION OF THE INVENTION

The ceramic substrate that may be used in the invention is based on either AlN or $Si_3N_4$ and the conductor pattern-forming metal plate to be joined to the ceramic substrate is a copper plate.

In the present invention, the BN content of the AlN or $Si_3N_4$ substrate is adjusted by controlling the prebaking conditions, the honing time, the honing pressure and the number of spray guns during the removal of the release agent and copper plates are joined to the substrates of varying BN content by the following procedures.

Two copper plates 0.3 mm and 0.25 mm thick are placed on opposite surfaces of the AlN or $Si_3N_4$ substrate, with a Ti-containing active metallic brazing material (comprising 71.0% Ag, 16.5% Cu and 2.5% Ti) interposed, and the assembly is fired at 850° C. in vacuo to join the two members together (this method is hereunder referred to as "active metal brazing assisted joining") and the copper plate on one surface is etched to form a specified circuit pattern, thereby producing a circuit board having the desired circuit pattern.

Alternatively, the AlN or $Si_3N_4$ substrate is fired in an air atmosphere to oxidize the surface layer and a specified copper pattern is directly joined to the substrate, thereby producing a circuit board having the desired conductor pattern (this method is hereunder referred to as "direct bonding").

Boron nitride which is commonly used as a release agent in the prebaking of nitride-based ceramic substrates remain in most cases at the grain boundaries of AlN or $Si_3N_4$ crystals in the surface layer of the substrate and if the content of residual boron nitride is excessive, sufficient strength of the joint cannot be attained even if the substrate has an appropriate level of surface roughness. This is because the aluminum or silicon nitride in the substrate has insufficient reactivity with boron nitride to provide satisfactory strength of joint between adjacent grains; in addition, the boron nitride crystals are so easy to cleave that they do not have sufficient strength.

As already disclosed in Unexamined Published Japanese Patent Application No. 53624/1994, the content of residual boron nitride is a critical factor in providing a high joint strength and the Applicants found that when $I_{BN}/I_{AlN}$, or the average refraction intensity of boron nitride relative to that of aluminum nitride, was controlled to be no more than $6 \times 10^{-2}$ for each of the (100), (002) and (101) faces, with a diffraction scan being taken of the surface of a ceramic substrate by means of an X-ray diffractometer (Rigaku Denki K.K.) with Cu used as a target at an acceleration voltage of 50 kV and an acceleration current of 30 mA, peel strengths of 30 kg/cm and more could be obtained.

As for the resistance to heat cycles, the heretofore attainable value of about 30 cycles has been satisfactory for commercial devices. However, circuit boards suitable for use with recent modules of power module require higher resistance to heat cycles, in addition to a peel strength of at least 30 kg/cm. According to the finding of the present inventors, the resistance to heat cycles was markedly improved when the ratio of B/Al or B/Si was controlled to be no more than $50 \times 10^{-6}$ in terms of the ratio of $I_B$ to $I_{Al}$ or the ratio of $I_B$ to $I_{Si}$ as defined previously.

The following examples are provided for the purpose of further illustrating the invention but are in no way to be taken as limiting.

EXAMPLE 1

Fourteen sets of sintered AlN substrates, each set consisting of 40 specimens, were provided in dimensions of 53×29×0.635 mm. The substrates were varied in the BN content by controlling the honing conditions (time, pressure and the number of spray guns). The values of B/Al in the respective substrates are shown in Table 1. Honing is the step of removing the release agent (e.g. BN) used in firing stacked ceramic substrates in order to prevent one substrate from adhering to another.

Copper plates 0.3 mm and 0.25 mm thick, respectively, were placed on opposite sides of seven out of the fourteen sets of AlN substrates, with an active metallic brazing paste being interposed that comprised 71.0 wt % Ag, 16.5 wt % Cu and 2.5 wt % Ti, and the assemblies were fired at 850° C. in vacuo to join the two members together; thereafter, the copper plates on one surface were etched to form a specified circuit pattern.

The other seven sets of AlN substrates were fired in an air atmosphere to oxidize their surface layers and, thereafter, copper plates each having a predetermined circuit pattern and flat copper plates were placed on opposite sides of the oxidized surfaces of the substrates and fired at 1,063° C. in an inert gas atmosphere so that the copper plates were joined directly to the substrates.

The resistance of the thus obtained joints to heat cycles was evaluated by the following procedure. After subjecting each sample of circuit board to specified numbers of heat cycles, each consisting of heating at 125° C. for 30 minutes and cooling at −40° C. for 30 minutes, the conductor pattern was removed from each sample and the development of cracks was checked by examining the surfaces of every ten samples of bare substrate with a microscope after 30, 50, 70 or 100 cycles; the results were evaluated by three criteria, ○ (cracking occurred in no samples, or 0/10), Δ (cracking occurred in one to three samples, or 1/10–3/10) and x (cracking occurred in four to ten samples, or 4/10–10/10), and the results are summarized in Table 1.

EXAMPLE 2

Five sets of sintered $Si_3N_4$ substrates, each set consisting of 50 specimens, were provided in dimensions of 53×29× 0.635 mm. The substrates were varied in the BN content by controlling the honing conditions (time, pressure and the number of spray guns). The values of B/Si in the respective substrates are shown in Table 2.

Copper plates 0.3 mm and 0.25 mm, respectively, were placed on opposite sides of each substrate, with a brazing paste of the same composition as in Example 1 being interposed, and the assemblies were fired at 850° C. in vacuo to join the two members together; thereafter, the copper plates on one surface of each joint were etched to form a specified circuit pattern.

The resistance of the thus obtained joints to heat cycles was tested under the same conditions as in Example 1 and the development of cracks was checked after 50, 100, 150, 200, 250 or 300 cycles; the results are summarized in Table 2.

TABLE 1

| Example No. | Run No. | | B/Al ($\times 10^{-6}$) | Cracking after heat cycles (n = 10) | | | | | |
|---|---|---|---|---|---|---|---|---|---|
| | | | | 30 | 50 | 70 | 100 | 150 | 200 |
| AlN substrate | Active metallic brazing assisted bonding | 1-1 | 9 | ○ | ○ | ○ | ○ | — | — |
| | | 1-2 | 18 | ○ | ○ | ○ | ○ | — | — |
| | | 1-3 | 24 | ○ | ○ | ○ | ○ | — | — |
| | | 1-4 | 33 | ○ | ○ | ○ | Δ | — | — |
| | | 1-5 | 47 | ○ | ○ | ○ | Δ | — | — |
| | | 1-6 (Comparison) | 76 | ○ | x | x | x | | |
| | | 1-7 (Comparison) | 82 | ○ | x | x | x | | |
| | Direct bonding | 1-8 | 9 | ○ | ○ | ○ | ○ | — | — |
| | | 1-9 | 18 | ○ | ○ | ○ | ○ | — | — |
| | | 1-10 | 24 | ○ | ○ | ○ | Δ | — | — |
| | | 1-11 | 33 | ○ | ○ | ○ | x | — | — |
| | | 1-12 | 47 | ○ | ○ | ○ | x | — | — |
| | | 1-13 (Comparison) | 76 | ○ | x | x | x | — | — |
| | | 1-14 (Comparison) | 82 | ○ | x | x | x | — | — |

TABLE 2

| Example No. | Run No. | | B/Si ($\times 10^{-6}$) | Cracking after heat cycles (n = 10) | | | | | |
|---|---|---|---|---|---|---|---|---|---|
| | | | | 50 | 100 | 150 | 200 | 250 | 300 |
| $Si_3N_4$ substrate | Active metallic brazing assisted bonding | 2-1 | 8 | ○ | ○ | ○ | ○ | ○ | ○ |
| | | 2-2 | 17 | ○ | ○ | ○ | ○ | ○ | ○ |
| | | 2-3 | 28 | ○ | ○ | ○ | ○ | ○ | ○ |
| | | 2-4 | 46 | ○ | ○ | ○ | ○ | Δ | Δ |
| | | 2-5 (Comparison) | 65 | ○ | ○ | Δ | x | x | x |

In Example 1, the circuit boards prepared by active metallic brazing assisted bonding could withstand up to 70 heat cycles when B/Al was no more than $50 \times 10^{-6}$ and cracking did not occur until after 100 heat cycles when B/Al was no more than $30 \times 10^{-6}$; the result was substantially the same in the circuit boards prepared by direct bonding.

The circuit boards of Example 2 which were prepared by active metallic brazing assisted bonding were free from cracking until after 200 heat cycles when B/Si was no more than $50 \times 10^{-6}$.

Thus, the resistance of AlN substrates to heat cycles could be improved from the order of 30 cycles to at least 70 cycles by controlling the ratio of B/Al in terms of the relative intensity of fluorescent X-rays; as for $Si_3N_4$ substrates, the improvement was from the order of 100 cycles to at least 200 cycles and this was accomplished by controlling the ratio of B/Si. As a result, the operational reliability of power module circuit boards could be markedly improved by the invention.

What is claimed is:

1. A power module circuit board comprising an AlN-based ceramic substrate having carried on at least one surface thereof a conductor pattern, said AlN-based ceramic substrate being mass-produced by sintering a plurality of stacked AlN-based ceramic substrates in the presence of a release agent comprising boron nitride, said boron nitride preventing one substrate from adhering to an adjacent substrate, a ratio of $I_B$ to $I_{Al}$ being no more than $50 \times 10^{-6}$, wherein $I_B$ represents the X-ray diffraction intensity of boron present on the surface of the AlN-based ceramic substrate and $I_{Al}$ represents the X-ray diffraction intensity of aluminum of the AlN-based ceramic substrate.

2. The power module circuit board according to claim 1, wherein the conductor pattern is formed of a metal plate that is joined to the AlN-based ceramic substrate with a brazing material interposed between said AlN-based ceramic substrate and said metal plate, said brazing material containing at least one active metal selected from the group consisting of Ti, Zr and Hf.

3. The power module circuit board according to claim 1, wherein the conductor pattern formed of a metal plate is joined directly to the AlN-based ceramic substrate after the AlN-based ceramic substrate has been partially oxidized on the surface thereof.

4. The power module circuit board according to claim 2, wherein the metal plate is a copper plate.

5. A power module circuit board comprising a $Si_3N_4$-based ceramic substrate having carried on at least one surface thereof a conductor pattern, said $Si_3N_4$-based ceramic substrate being mass-produced by sintering a a plurality of stacked $Si_3N_4$-based ceramic substrates in the presence of a release agent comprising boron nitride, said boron nitride preventing one substrate from adhering to an adjacent substrate, a ratio of $I_B$ to $I_{Si}$ being no more than $50 \times 10^{-6}$, wherein $I_B$ represents the X-ray diffraction intensity of boron present on the surface of the $Si_3N_4$-based ceramic substrate and $I_{Si}$ represents the X-ray diffraction intensity of silicon of the $Si_3N_4$-based ceramic substrate.

6. The power module circuit board according to claim 5, wherein the conductor pattern is formed of a metal plate that is joined to the $Si_3N_4$-based ceramic substrate with a brazing material interposed between said $Si_3N_4$-based ceramic substrate and said metal plate, said brazing material containing at least one active metal selected from the group consisting of Ti, Zr and Hf.

7. The power module circuit board according to claim 5, wherein the conductor pattern formed of a metal plate is joined directly to the $Si_3N_4$-based ceramic substrate after the $Si_3N_4$-based ceramic substrate has been partially oxidized on the surface thereof.

8. The power module circuit board according to claim 6, wherein the metal plate is a copper plate.

9. A process for producing a power module circuit board comprising an AlN-based ceramic substrate, having carried on at least one surface thereof a conductor pattern, said conductor pattern being formed of a metal plate, which process comprises:

(a) forming a conductor pattern on at least one principal surface of the AlN-based ceramic substrate, with a brazing material being interposed between said AlN-based ceramic substrate and said metal plate, said AlN-based ceramic substrate being mass-produced by sintering a plurality of stacked AlN-based ceramic substrates in the presence of a release agent comprising boron nitride, said boron nitride preventing one substrate from adhering to an adjacent substrate, a ratio of $I_B$ to $I_{Al}$ being no more than $50 \times 10^{-6}$, wherein $I_B$ is the X-ray diffraction intensity of boron present on the surface of the AlN-based ceramic substrate and $I_{Al}$ is the X-ray diffraction intensity of aluminum of the AlN-based ceramic substrate, said brazing material containing at least one element selected from the group consisting of Ti, Zr and Hf or a hydroxide or oxide of said element, and (b) heating the resultant combination from step (a) in a vacuum so that the metal plate is joined to said AlN-based ceramic substrate.

10. The process according to claim 9, wherein the metal plate is a copper plate.

11. A process for producing a power module circuit board comprising an $Si_3N_4$-based ceramic substrate, having carried on at least one surface thereof a conductor pattern, said conductor pattern being formed of a metal plate, which process comprises:

(a) forming a conductor pattern on at least one principal surface of the $Si_3N_4$-based ceramic substrate, with a brazing material being interposed between said $Si_3N_4$-based ceramic substrate and said metal plate, said $Si_3N_4$-based ceramic substrate being mass-produced by sintering a plurality of stacked $Si_3N_4$-based ceramic substrates in the presence of a release agent comprising boron nitride, said boron nitride preventing one substrate from adhering to an adjacent substrate and, a ratio of $I_B$ to $I_{Si}$ being no more than $50 \times 10^{-6}$, wherein $I_B$ represents the X-ray diffraction intensity of boron present on the surface of the $Si_3N_4$-based ceramic substrate and $I_{Si}$ represents the X-ray diffraction intensity of silicon of the $Si_3N_4$-based ceramic substrate, said brazing material containing at least one element selected from the group consisting of Ti, Zr and Hf, or a hydroxide or oxide of said element, and (b) heating the resultant combination from step (a) in a vacuum so that the metal plate is joined to said $Si_3N_4$-based ceramic substrate.

12. The process according to claim 11, wherein the metal plate is a copper plate.

* * * * *